(12) United States Patent
Chen et al.

(10) Patent No.: US 10,032,759 B2
(45) Date of Patent: Jul. 24, 2018

(54) HIGH-DENSITY SEMICONDUCTOR DEVICE

(71) Applicant: Taiwan Semiconductor Manufacturing Company Limited, Hsinchu (TW)

(72) Inventors: Chih-Liang Chen, Hsinchu (TW); Chih-Ming Lai, Hsinchu (TW); Charles Chew-Yuen Young, Cupertino, CA (US); Jiann-Tyng Tzeng, Hsinchu (TW); Kam-Tou Sio, Hsinchu County (TW); Ru-Gun Liu, Hsinchu County (TW); Wei-Hao Wu, Hsinchu (TW); Lei-Chun Chou, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/598,516

(22) Filed: May 18, 2017

(65) Prior Publication Data

US 2018/0151551 A1 May 31, 2018

Related U.S. Application Data

(60) Provisional application No. 62/426,923, filed on Nov. 28, 2016.

(51) Int. Cl.
| | | |
|---|---|---|
| *H01L 27/02* | (2006.01) | |
| *H01L 21/8234* | (2006.01) | |
| *H01L 21/306* | (2006.01) | |
| *H01L 27/088* | (2006.01) | |
| *H01L 23/528* | (2006.01) | |
| *H01L 21/768* | (2006.01) | |
| *H01L 21/3213* | (2006.01) | |
| *H01L 29/06* | (2006.01) | |
| *H03K 19/0944* | (2006.01) | |

(52) U.S. Cl.
CPC .... *H01L 27/0207* (2013.01); *H01L 21/30604* (2013.01); *H01L 21/32139* (2013.01); *H01L 21/76895* (2013.01); *H01L 21/823431* (2013.01); *H01L 21/823475* (2013.01); *H01L 21/823481* (2013.01); *H01L 23/528* (2013.01); *H01L 27/0886* (2013.01); *H01L 29/0649* (2013.01); *H03K 19/0944* (2013.01)

(58) Field of Classification Search
CPC ............... H01L 27/0207; H01L 23/528; H01L 21/823481; H01L 21/32139; H01L 21/76895; H01L 29/0649; H01L 27/0886; H01L 21/30604; H01L 21/823431; H01L 21/823475; H03K 19/0944
See application file for complete search history.

(56) References Cited

U.S. PATENT DOCUMENTS 9,287,135 B1 * 3/2016 Doris ................ H01L 21/31144
9,455,347 B1 * 9/2016 Leobandung ..... H01L 29/66795
(Continued)

*Primary Examiner* — William Coleman
(74) *Attorney, Agent, or Firm* — Jones Day

(57) ABSTRACT

A method of manufacturing a semiconductor device includes providing a material above a substrate and respectively forming separate gate electrode lines on opposite sidewalls of the material. As such, a width of cut between the gate electrode lines can be minimized. This shortens a height of cell of the semiconductor device, increasing a cell density of the semiconductor device.

20 Claims, 25 Drawing Sheets

(56) References Cited

U.S. PATENT DOCUMENTS

| | | | |
|---|---|---|---|
| 9,564,446 B1* | 2/2017 | Weybright | H01L 21/3065 |
| 9,653,579 B2* | 5/2017 | Liu | H01L 29/66795 |
| 9,685,507 B2* | 6/2017 | Basker | H01L 29/0649 |
| 2017/0263454 A1* | 9/2017 | Li | H01L 21/823431 |
| 2017/0271500 A1* | 9/2017 | Cheng | H01L 29/785 |
| 2017/0287909 A1* | 10/2017 | Oh | H01L 27/0886 |

* cited by examiner

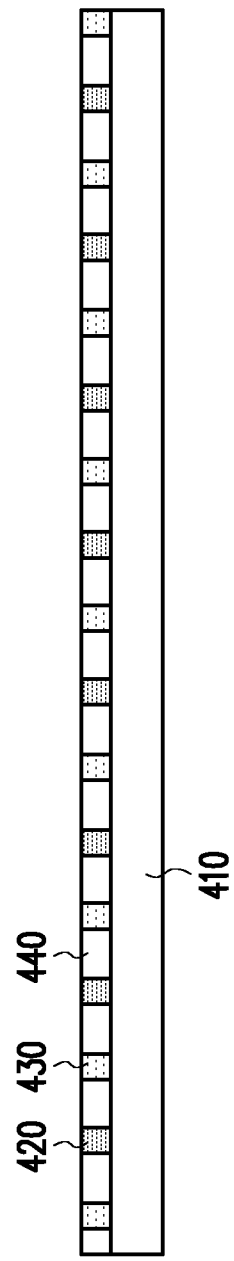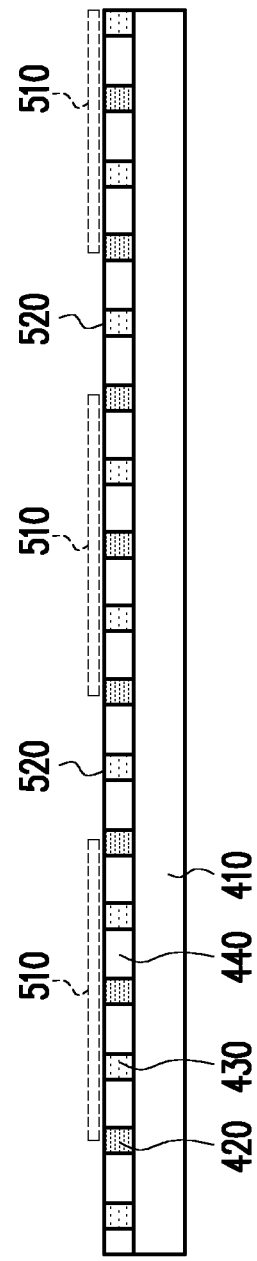

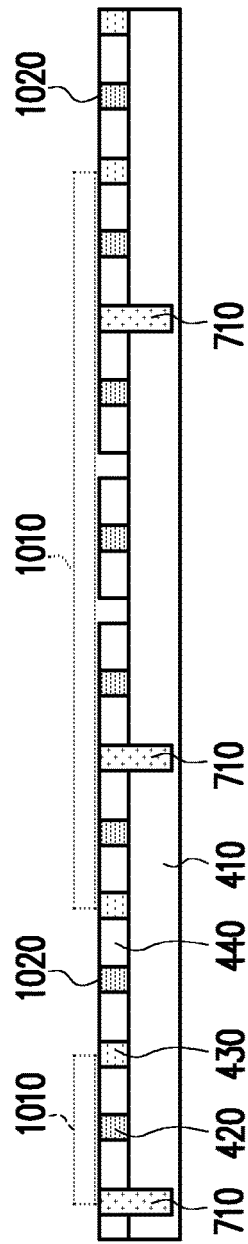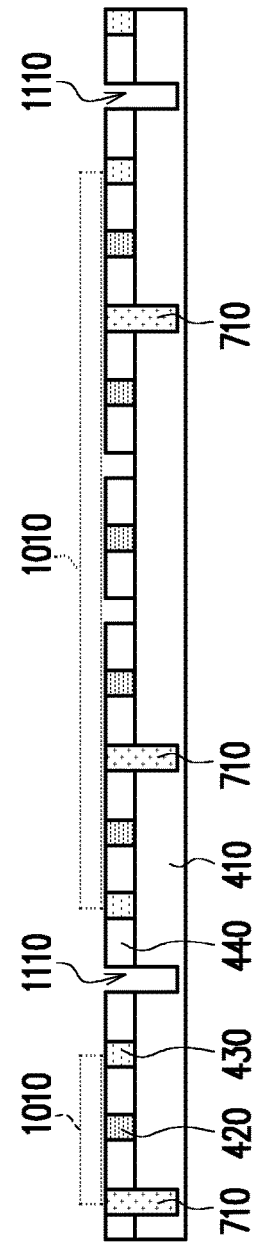
FIG. 10
FIG. 11

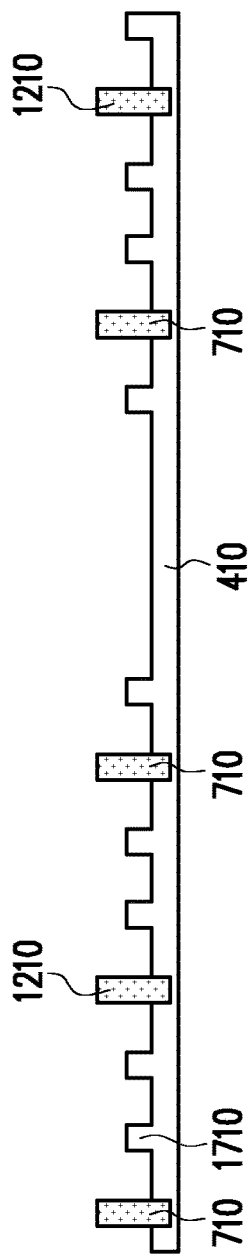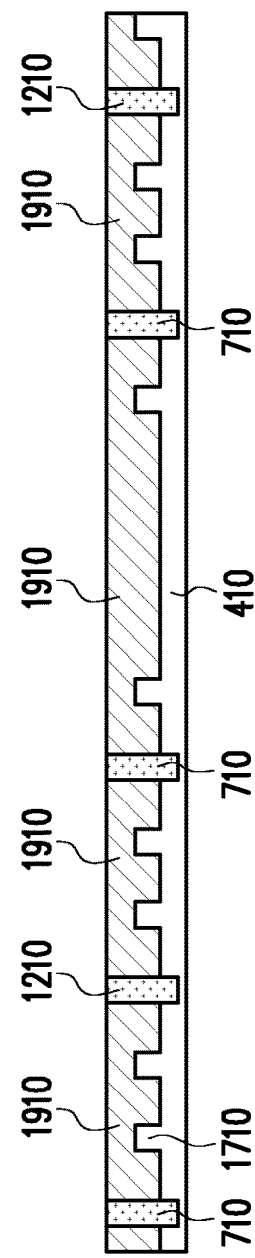

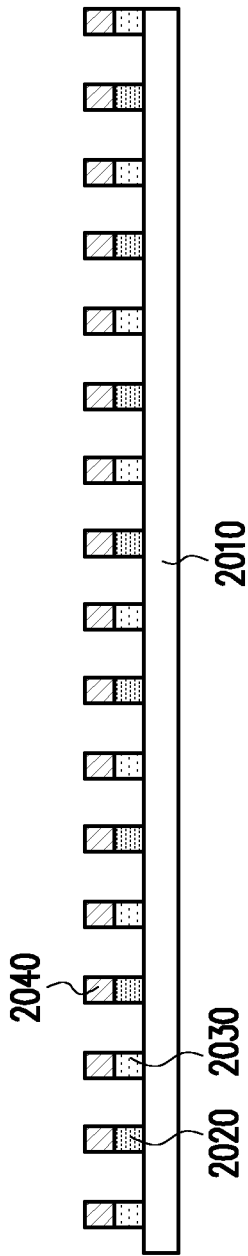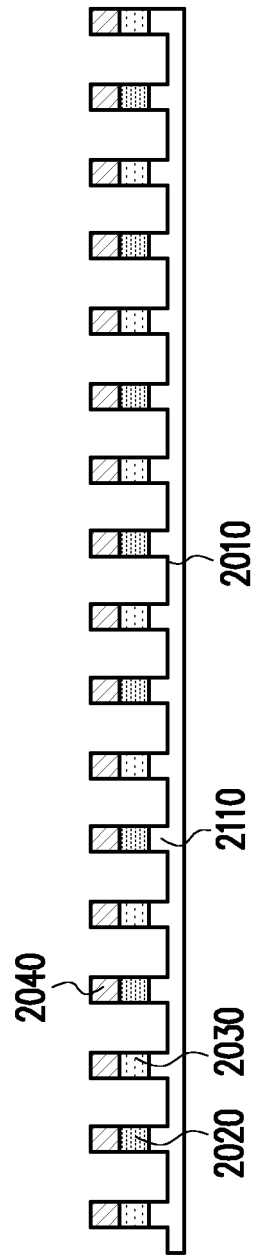

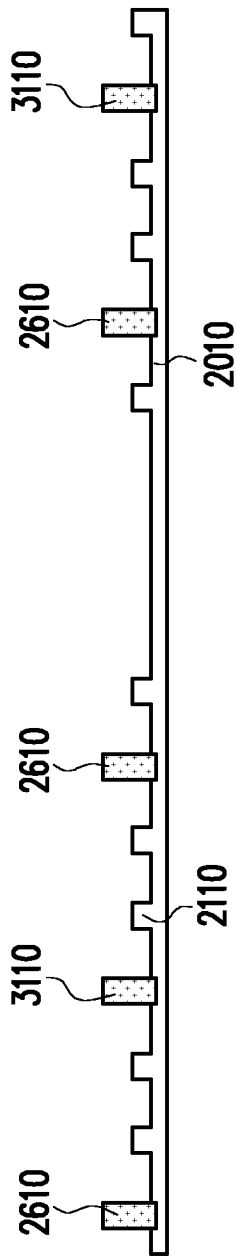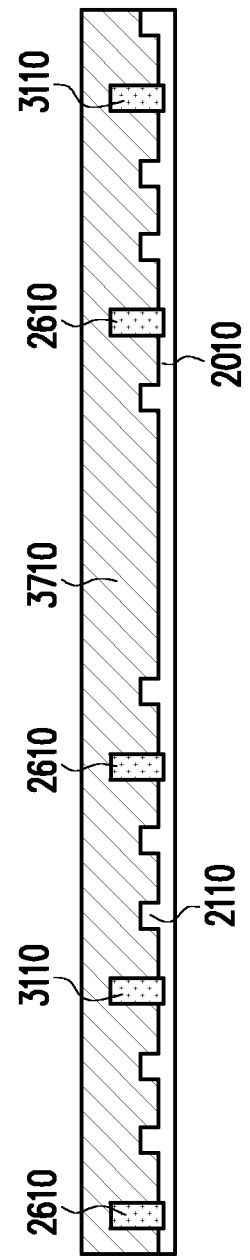

HIGH-DENSITY SEMICONDUCTOR DEVICE

CROSS-REFERENCE TO RELATED APPLICATION

This application claims priority to U.S. Provisional Patent Application No. 62/426,923, filed Nov. 28, 2016, which is incorporated herein by reference in its entirety.

BACKGROUND

A semiconductor device includes a plurality of cells. A cell, such as a standard cell, includes one or more logic gates, e.g., a NOT gate or an inverter. Semiconductor functionality can be expanded by increasing the number of cells provided on the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-19 are sectional views of a semiconductor device at various stages of manufacturing.

FIGS. 20-38 are sectional views of a semiconductor device at various stages of manufacturing.

DETAILED DESCRIPTION

Figure 1:
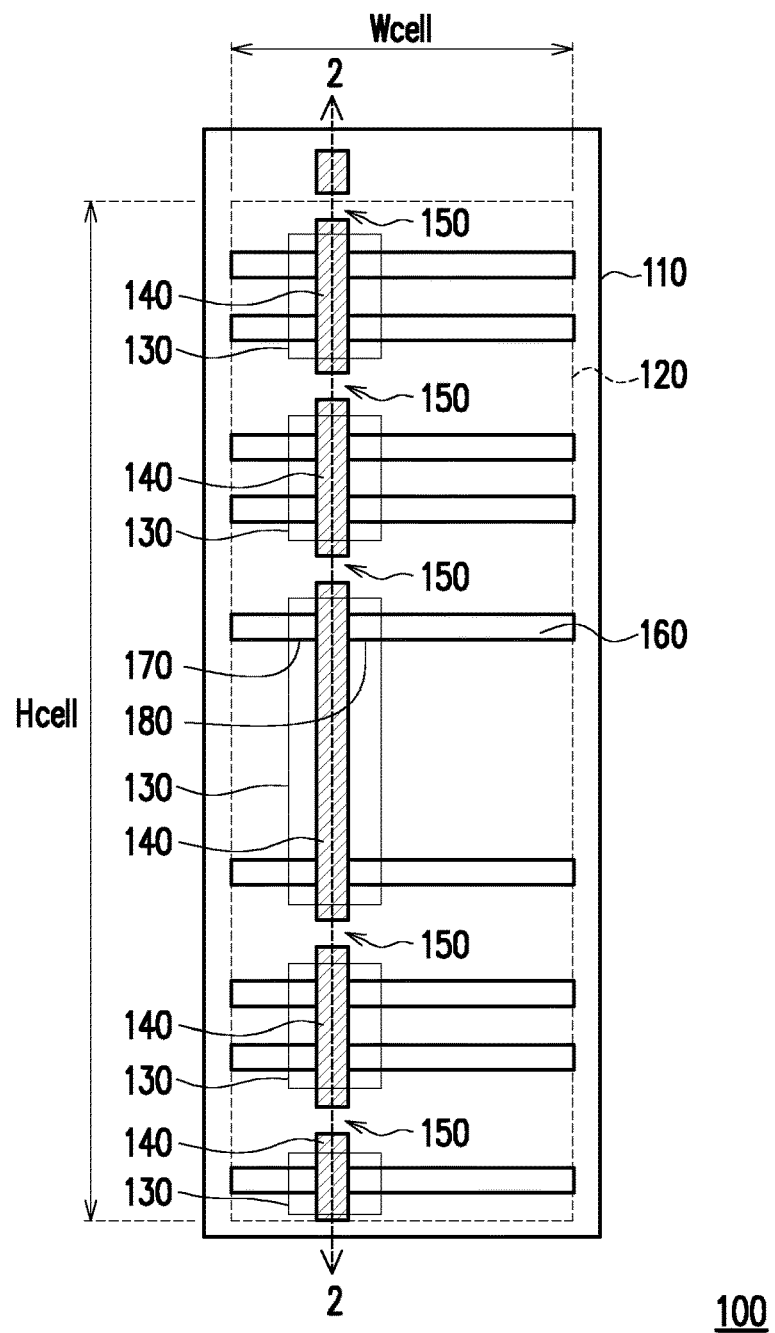
FIG. 1 is a schematic top view of the first exemplary embodiment of a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic top view of the first exemplary embodiment of a semiconductor device 100. The example semiconductor device 100 includes a substrate 110 and a cell 120. The cell 120 is configured to perform a circuit function. For example, the cell 120 can implement an inverter that inverts a signal from low to high and vice versa. In some embodiments, the cell 120 includes an AND gate, a NAND gate, an OR gate, a NOR gate, an XOR gate, an XNOR gate, another logic gate, or a combination thereof. Such a cell 120 can therefore be termed as a standard cell. In other embodiments, the cell 120 includes a logic gate and a passive/active device, e.g., a resistor, a capacitor, an inductor, a transistor, a diode, or the like.

As illustrated in FIG. 1, the cell 120 is above the substrate 110, is enclosed by a boundary (indicated by dash lines), has a cell height (Hcell) and a cell width (Wcell), and includes one or more transistors 130. Each of the transistors 130 includes a gate electrode line 140 that extends in a first direction. The gate electrode lines 140 are arranged along the length of the substrate 110. Each adjacent pair of gate electrode lines 140 are separated by a cut 150 therebetween, the cut 150 having a width by which the neighboring gate electrode lines 140 are separated. Each of the transistors 130 further includes one or more fins 160 that extend in a second direction transverse to the first direction. For clarity of illustration, only one of the fins 160 is labeled in FIG. 1. Each of the fins 160 has a source region 170, a drain region 180, and a channel region between the source and drain regions 170, 180 and overlaid by a gate electrode line 140.

With reference back to the gate electrode line cuts 150, the cuts 150 may be formed by a lithographic process, in which: a mask layer is first provided over a gate electrode material; then a pattern is transferred to the mask layer to form openings therein, thereby exposing portions of the gate electrode material therethrough; and then the exposed portions of the gate electrode material is etched through the openings to thereby cut the gate electrode material into the gate electrode lines 140. The cut 150 can be no less than a certain minimum cut width because a pattern of the mask layer begins to blur when a cut width smaller than the threshold is attempted. It is desirable to form the cut 150 at a cut width less than the minimum to thereby shorten the cell height (Hcell) of the cell 120, increasing density of cells of the semiconductor device 100.

Figure 7:
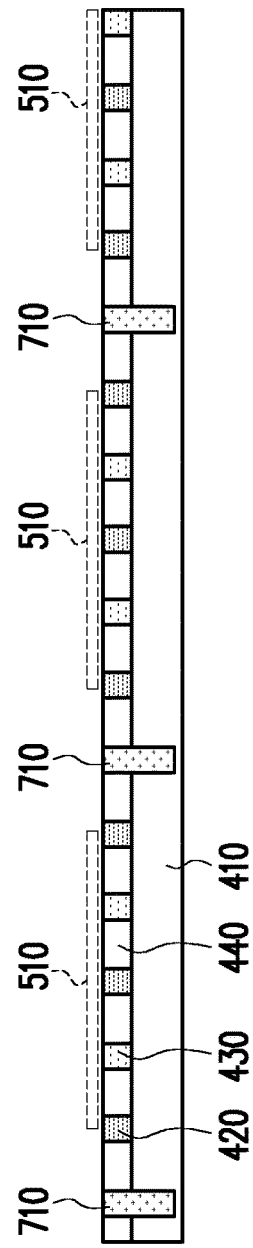

The present disclosure provides various exemplary methods of manufacturing a semiconductor device, e.g., the semiconductor device 100, capable of achieving a high density of cells for the semiconductor device. As described in detail below, in one implementation, a cut material, e.g., cut material 710 in FIG. 7, is first provided above a substrate of the semiconductor device. Then, a gate electrode material, e.g., gate electrode material 1910 in FIG. 19, is deposited over the substrate and the cut material. Then, excess gate electrode material, i.e., the gate electrode material on a top surface of the cut material, is removed to thereby cut the gate electrode material into a pair of gate electrode lines, e.g., an adjacent pair of the gate electrode lines 140. Thereafter, the cut material is removed from the semiconductor device. Such a method forms a cut having a cut width that is smaller than the minimum cut width threshold. This shortens a cell height of a cell of the semiconductor device, enabling the semiconductor device to have a higher density of cells.

Figure 2:
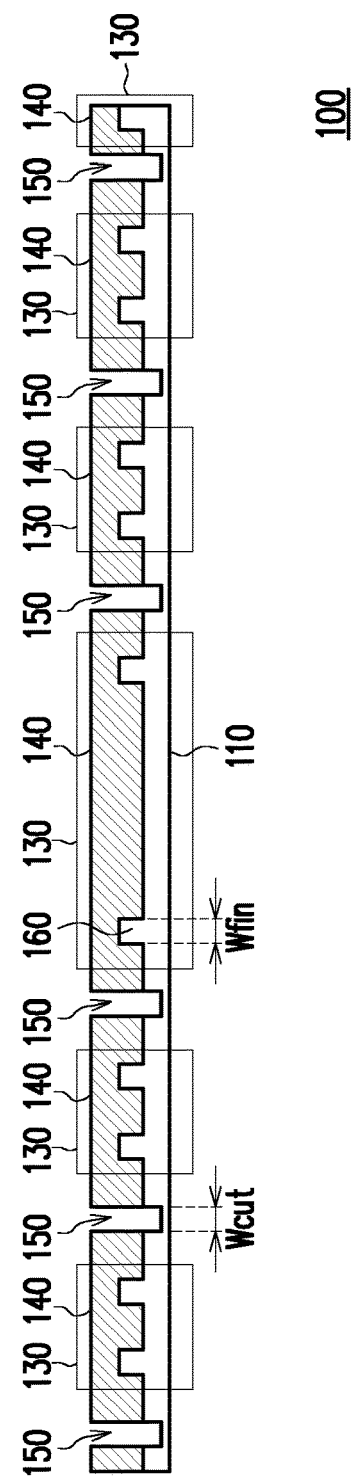
FIG. 2 is a sectional view taken along line 2-2 of FIG. 1.

FIG. 2 is a sectional view taken along line 2-2 of FIG. 1. In this embodiment, a fin 160 has a fin width (Wfin). A cut 150 has a cut width (Wcut) substantially equal to the fin width (Wfin), in one example. For example, the cut width (Wcut) is about 0.8 to about 1.2 of the fin width (Wfin).

Figure 3:
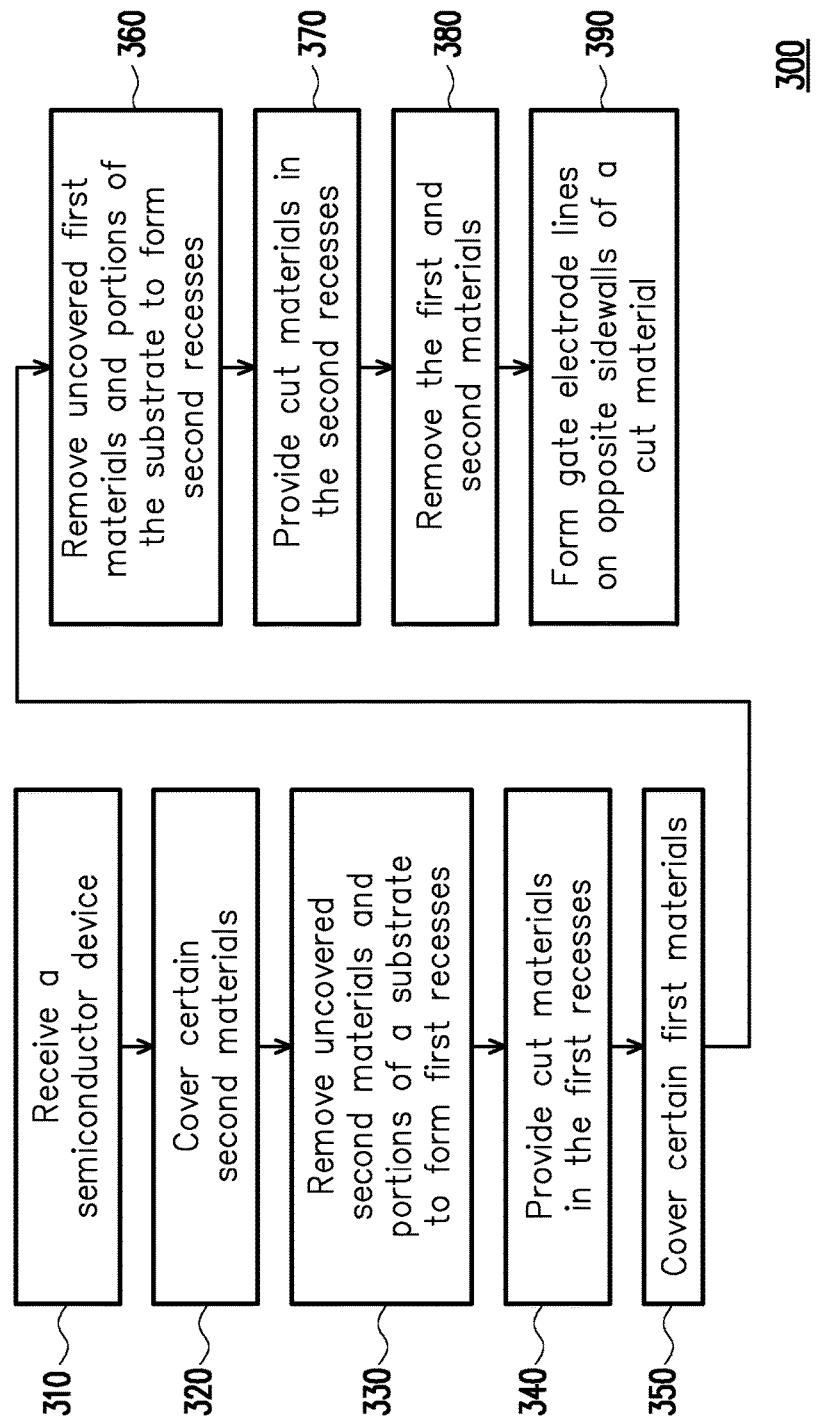
FIG. 3 is a flow chart illustrating an exemplary method of manufacturing a semiconductor device.

FIG. 3 is a flow chart illustrating an exemplary method 300 of manufacturing a semiconductor device, e.g., the semiconductor device 100, that is described with reference to certain examples in subsequent figures. In operation 310, a semiconductor device is received. The semiconductor device includes a substrate and first and second materials, e.g., as described in further detail below in FIG. 4 at 420, 430, above the substrate. In operation 320, certain of the second materials are covered by a protective layer, e.g., as described in further detail below in FIG. 5 at 510. Materials for a protective layer include, but are not limited to, silicon oxide, silicon nitride, silicon oxynitride, another protective layer material, and a combination thereof. In operation 330, second materials, e.g., as described in further detail below in FIG. 5 at 520, not covered by the protective layer and portions of the substrate thereunder are removed to form recesses, e.g., as described in further detail below in FIG. 6 at 610. In operation 340, cut materials, e.g. as described in further detail below in FIG. 7 at 710, are provided in the recesses. In operation 350, certain of the first materials are covered by a second protective layer, e.g., as described in further detail below in FIG. 10 at 1010. In operation 360, first materials, e.g., as described in further detail below in FIG. 10 at 1020, not covered by the second protective layer and portions of the substrate thereunder are removed to form second recesses, e.g., as described in further detail below in FIG. 11 at 1110. In operation 370, cut materials, e.g. as described in further detail below in FIG. 12 at 1210, are provided in the second recesses. In operation 380, the first and second materials are removed. In operation 390, a pair of gate electrode lines, e.g., as described in further detail below in FIG. 19 at 1910, are respectively formed on opposite sidewalls of a cut material.

FIGS. 4-19 are sectional views of a semiconductor device at various stages of manufacturing, e.g., as produced using operations described above with reference to FIG. 3. The method 300 will now be described with further reference to FIGS. 4-19 for ease of understanding. It should be understood that the method 300 is applicable to structures other than those of FIGS. 4-19.

FIG. 4 illustrates an exemplary structure of a semiconductor device received after performance of a receiving operation, e.g., operation 310. The semiconductor device includes a substrate 410, first and second materials 420, 430, and a dielectric layer 440. For clarity of illustration, only one of the first materials 420 and only one of the second materials 430 are labeled in FIG. 4. The first and second materials 420, 430 are above the substrate 410 and are alternately arranged along the length of the substrate 410. In this embodiment, a second material 430 has an etch selectivity different from an etch selectivity of a first material 420. In an alternative embodiment, a second material 430 is the same as a first material 420. The substrate 410 is a bulk or semiconductor-on-insulator (SOI) substrate and includes silicon, germanium, another semiconductor material, such as a III-V material, or a combination thereof.

The dielectric layer 440 is over the substrate 410 and surrounds the first and second materials 420, 430. The dielectric layer 440 in this embodiment serves as a shallow trench isolation (STI) feature and is thus configured to prevent electric current leakage among components, e.g., the transistors 130, of a cell, e.g., the cell 120, of the semiconductor device. The dielectric layer 440 includes an STI material that has an etch selectivity different from those of the first and second materials 420, 430. Materials for the dielectric layer 440 include, but are not limited to, silicon oxide, silicon nitride, silicon oxynitride, another STI material, and a combination thereof.

FIG. 5 illustrates an exemplary structure of the semiconductor device resulting after performance of a first covering operation, e.g., operation 320, and depicts certain of the second materials 430 are covered with a first protective layer (indicated by dash lines 510). As illustrated in FIG. 5, particular instances of second materials 520 are not covered by the first protective layer 510. As described below, these second materials 520 and portions of the substrate 410 overlaid thereby will be replaced by cut materials. These cut materials are for separating a gate electrode material into gate electrode lines, e.g., an adjacent pair of the gate electrode lines 140.

Figure 6:
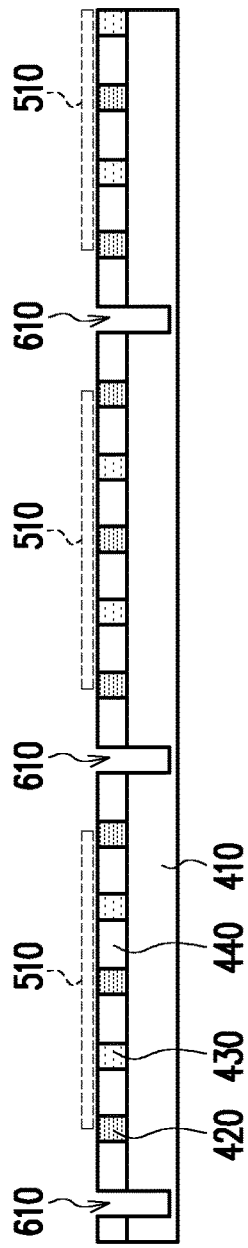

FIG. 6 illustrates an exemplary structure of the semiconductor device resulting after performance of a first removing operation, e.g., operation 330, and depicts the second materials 520 not covered by the first protective layer 510 and the substrate 410 underlying those second materials 520 are dry or wet etched, forming recesses 610. As illustrated in FIG. 6, the recesses 610 extend through the dielectric layer 440 and into the substrate 410.

FIG. 7 illustrates an exemplary structure of the semiconductor device resulting after performance of a first providing operation, e.g., operation 340, and depicts the recesses 610 are provided/filled with cut materials 710. As illustrated in FIG. 7, the cut materials 710 extend from above the substrate 410 and into the substrate 410. The first providing operation is performed using a deposition process, such as chemical vapor deposition (CVD), atomic layer deposition (ALD), physical vapor deposition (PVD), or the like.

Figure 8:
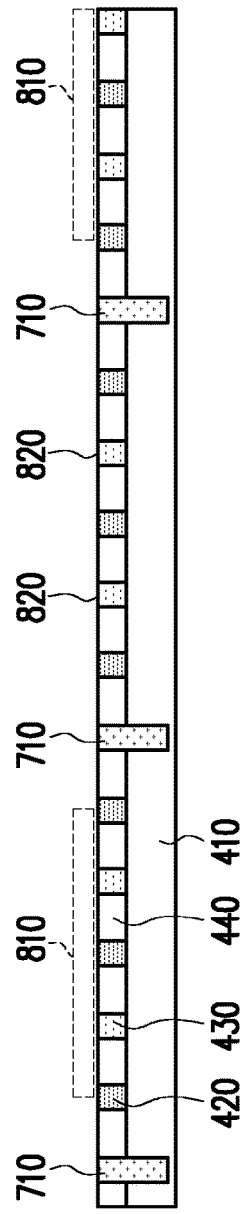

FIG. 8 illustrates an exemplary structure of the semiconductor device resulting after the first protective layer 510 is stripped and certain of the second materials 430 are covered with a second protective layer (indicated by dash lines 810). As illustrated in FIG. 8, particular instances of second materials 820 are not covered by the second protective layer 810. As is apparent below, these second materials 820 will be removed so as not to form dummy fins from portions of the substrate 410 overlaid thereby during formation of active fins, e.g., a fin 160.

Figure 9:
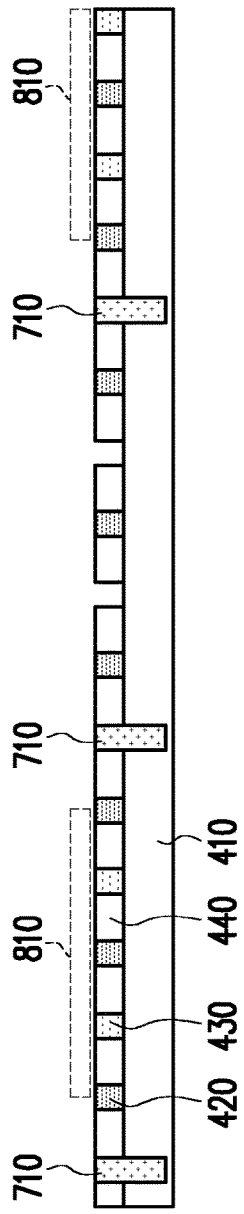

FIG. 9 illustrates an exemplary structure of the semiconductor device resulting after the second materials 820 not covered by the second protective layer 810 are etched, wet or dry, exposing the substrate 410 underlying those second materials 820.

FIG. 10 illustrates an exemplary structure of the semiconductor device resulting after the second protective layer 810 is stripped and performance of a second covering operation, e.g., operation 350, and depicts certain of the first materials 420 are covered with a third protective layer (indicated by dash lines 1010). As illustrated in FIG. 10, particular instances of first materials 1020 are not covered by the third protective layer 1010. As described below, these first materials 1020 and portions of the substrate 410 overlaid thereby will be replaced by cut materials. These cut materials, similar to the cut materials 710, separate a gate electrode material into gate electrode lines, e.g., another adjacent pair of the gate electrode lines 140.

FIG. 11 illustrates an exemplary structure of the semiconductor device resulting after performance of a second removing operation, e.g., operation 360, and depicts the first materials 1020 not covered by the third protective layer 1010 and the substrate 410 underlying those first materials 1020 are dry or wet etched to form recesses 1110. As illustrated in FIG. 11, the recesses 1110, similar to the recesses 610, extend through the dielectric layer 440 and into the substrate 410.

Figure 12:
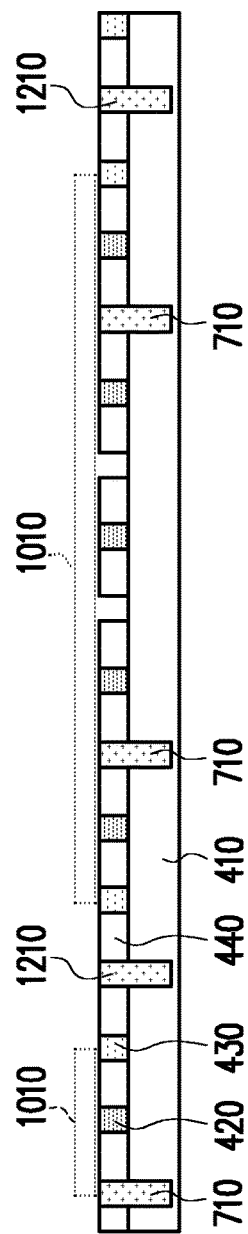

FIG. 12 illustrates an exemplary structure of the semiconductor device resulting after performance of a second providing operation, e.g., operation 370, and depicts the recesses 1110 are provided/filled, such as by CVD, ALD, PVD, or the like, with cut materials 1210. As illustrated in FIG. 12, the cut materials 1210 extend from above the substrate 410 and into the substrate 410. A cut material 1210 may be the same as or different from a cut material 710.

Figure 13:
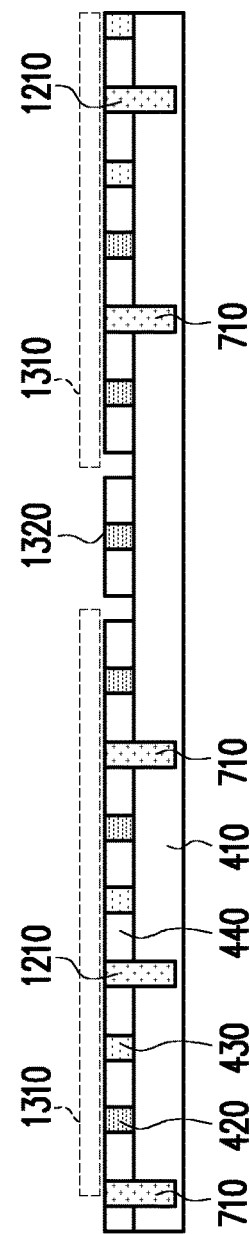

FIG. 13 illustrates an exemplary structure of the semiconductor device resulting after the third protective layer 1010 is stripped and certain of the first materials 420 are covered with a fourth protective layer (indicated by dash lines 1310). As illustrated in FIG. 13, particular instances of first materials, e.g., first material 1320, are not covered by the fourth protective layer 1310. As is apparent below, these first materials will be removed so as not to form dummy fins from portions of the substrate 410 overlaid thereby during formation of active fins, e.g., another fin 160.

Figure 14:
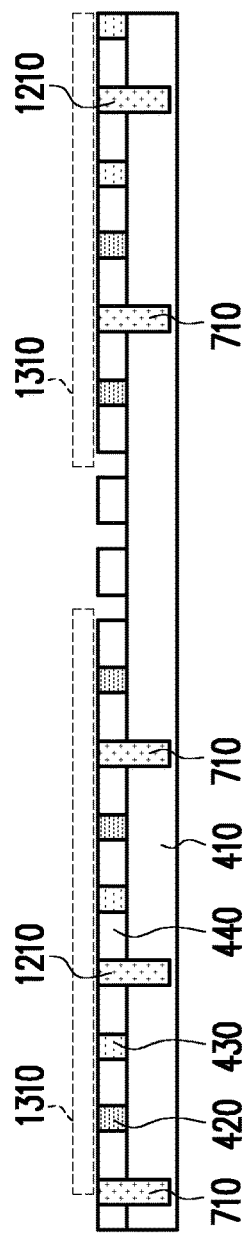
Figure 15:
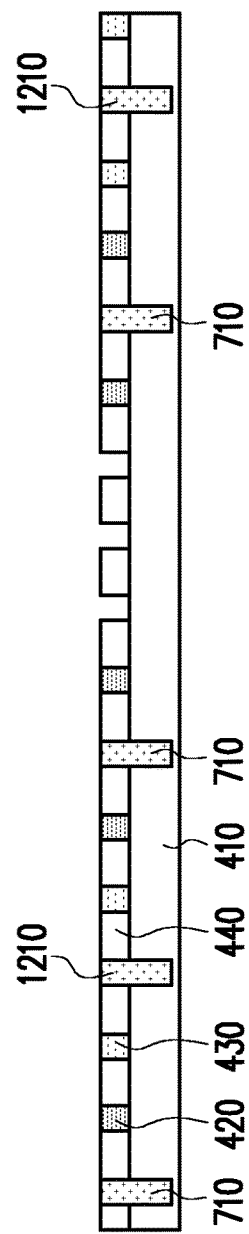
Figure 16:
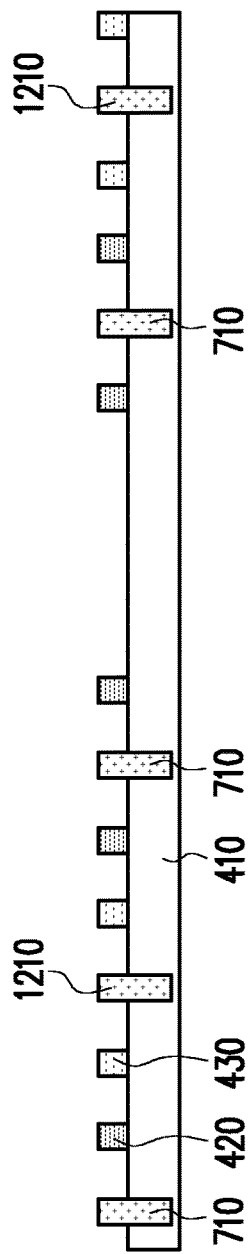

FIG. 14 illustrates an exemplary structure of the semiconductor device resulting after the first materials, e.g., the first material 1320, not covered by the fourth protective layer 1310 are etched, wet or dry, exposing the substrate 410 underlying those first materials. FIG. 15 illustrates an exemplary structure of the semiconductor device resulting after the fourth protective layer 1310 is stripped, exposing the dielectric layer 440 thereunder. FIG. 16 illustrates an exemplary structure of the semiconductor device resulting after the dielectric layer 440 is dry or wet etched, exposing the substrate 410 thereunder.

Figure 17:
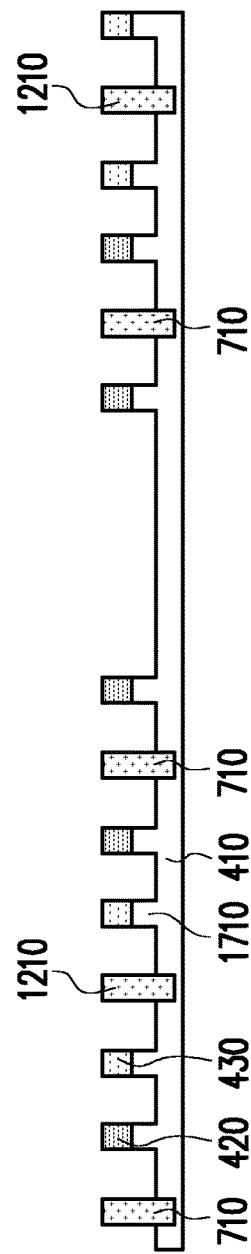

FIG. 17 illustrates an exemplary structure of the semiconductor device resulting after the substrate 410 is dry or wet etched to form fins 1710, i.e., active fins, e.g., the fins 160, under the first and second materials 420, 430. For clarity of illustration, only one of the fins 1710 is labeled in FIG. 17.

FIG. 18 illustrates an exemplary structure of the semiconductor device resulting after performance of a third removing operation, e.g., operation 380, and depicts the first and second materials 420, 430 are removed, such as by a dry or wet etching process, exposing the fins 1710.

FIG. 19 illustrates an exemplary structure of the semiconductor device resulting after performance of a forming operation, e.g., operation 390, and depicts gate electrode lines 1910 (e.g., the gate electrode lines 140), an adjacent pair of which are respectively formed on opposite sidewalls of a cut material 710/1210. In this embodiment, the forming operation includes: depositing a gate electrode material over the structure of FIG. 18; performing a chemical mechanical planarizing (CMP) process on the gate electrode material to remove excess gate electrode material, i.e., the gate electrode material on top surfaces of the cut materials 710, 1210, to thereby cut the gate electrode material into the gate electrode lines 1910. Thereafter, the cut materials 710, 1210 are removed, such as by a wet or dry etching process, thereby resulting, e.g., in the structure of FIG. 2. In an alternative embodiment, a cut material 710/1210 is retained in the semiconductor device.

Although the above-described operations are applied in the fabrication of one cell of a semiconductor device, two or more cells of a semiconductor device may be simultaneously fabricated using such operations.

FIGS. 20-38 are sectional views of a semiconductor device at various stages of manufacturing, e.g., as produced using operations described above with reference to FIG. 3. Unlike the example of FIGS. 4-19 that does not form dummy fins, the example of FIGS. 20-28 forms dummy fins at the same as the formation of active fins. The dummy fins are removed at a latter operation, e.g., prior to formation of gate electrode lines.

The method 300 will now be described with further reference to FIGS. 20-38 for ease of understanding. It should be understood that the method 300 is applicable to structures other than those of FIGS. 20-38.

FIG. 20 illustrates an exemplary structure of the semiconductor device received after performance of a receiving operation, e.g., operation 310. The semiconductor device includes a substrate 2010, first and second materials 2020, 2030, and hard mask materials 2040. For clarity of illustration, only one of the first materials 2020, only one of the second materials 2030, and only one of the hard mask materials 2040 are labeled in FIG. 20. The first and second materials 2020, 2030 are above the substrate 2010 and are alternately arranged along the length of the substrate 2010. In this embodiment, a second material 2030 has an etch selectivity different from an etch selectivity of a first material 2020. In an alternative embodiment, a second material 2030 is the same as a first material 2020. The substrate 2010 is a bulk or semiconductor-on-insulator (SOI) substrate and includes silicon, germanium, another semiconductor material, such as a III-V material, or a combination thereof.

Each of the hard mask materials 2040 is over a respective one of the first materials 2020 and a respective one of the second materials 2030. As described below, the hard mask materials 2040 will be used as etch masks for etching the substrate 2010 to form active/dummy fins. A hard mask material 2040 include, but are not limited to, silicon oxide, silicon nitride, silicon oxynitride, another hard mask material, and a combination thereof.

FIG. 21 illustrates an exemplary structure of the semiconductor device resulting after the substrate 2010 is dry or wet etched using the hard mask materials 2040 to form fins 2110, i.e., active and dummy fins, under the first and second materials 2020, 2030. For clarity of illustration, only one of the fins 2110 is labeled in FIG. 21.

Figure 22:
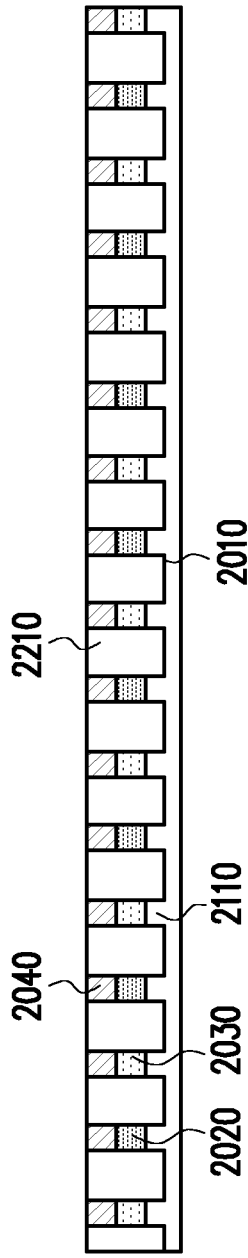

FIG. 22 illustrates an exemplary structure of the semiconductor device resulting after a dielectric layer 2210 is formed over the substrate 2010 and surrounding the fins 2110 and the materials 2020, 2030, 2040. The dielectric layer 440 in this embodiment serves as an STI feature and is thus configured to prevent electric current leakage among components, e.g., the transistors 130, of a cell, e.g., the cell 120, of the semiconductor device. Materials for the dielectric layer 2210 include, but are not limited to, silicon oxide, silicon nitride, silicon oxynitride, another STI material, and a combination thereof.

The formation of the dielectric layer 2210 includes depositing, such as by ALD, PVD, CVD, or the like, the dielectric layer 2210 over the structure of FIG. 21 and performing a CMP process on the dielectric layer 2210 to remove excess dielectric layer, i.e., the dielectric layer 2210 on top surfaces of the hard mask materials 2040.

Figure 23:
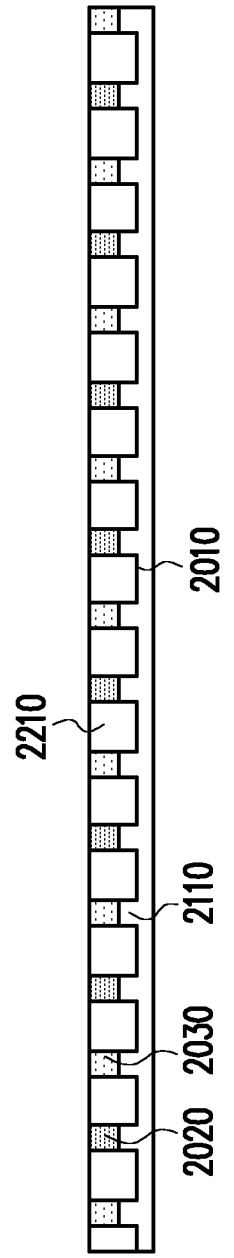

FIG. 23 illustrates an exemplary structure of the semiconductor device resulting after another CMP process is performed on the structure of FIG. 22 to remove the hard mask materials 2040.

Figure 24:
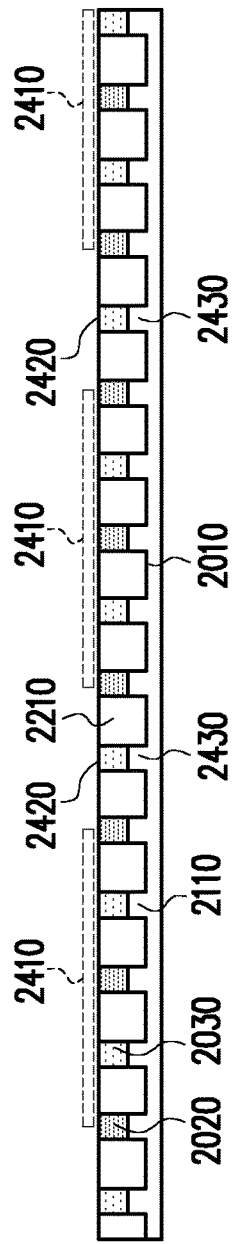

FIG. 24 illustrates an exemplary structure of the semiconductor device resulting after performance of a first covering operation, e.g., operation 320, and depicts certain of the second materials 2030 are covered with a first protective layer (indicated by dash lines 2410). As illustrated in FIG. 5, particular instances of second materials 2420 are not covered by the first protective layer 2410. As described below, these second materials 2420 and the fins 2430 overlaid thereby will be replaced by cut materials. These cut materials are for separating a gate electrode material into gate electrode lines, e.g., an adjacent pair of the gate electrode lines 140.

Figure 25:
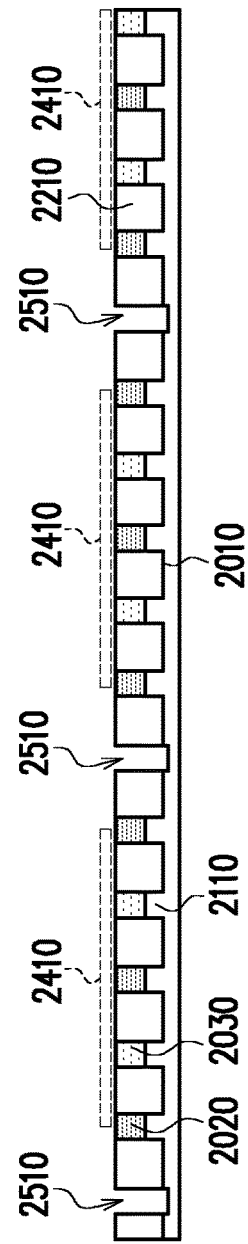

FIG. 25 illustrates an exemplary structure of the semiconductor device resulting after performance of a first removing operation, e.g., operation 330, and depicts the second materials 2420 not covered by the first protective layer 2410 and the fins 2430 underlying those second materials 2420 are dry or wet etched, forming recesses 2510. As illustrated in FIG. 25, the recesses 2510 extend through the dielectric layer 2210 and into the substrate 2010.

Figure 26:
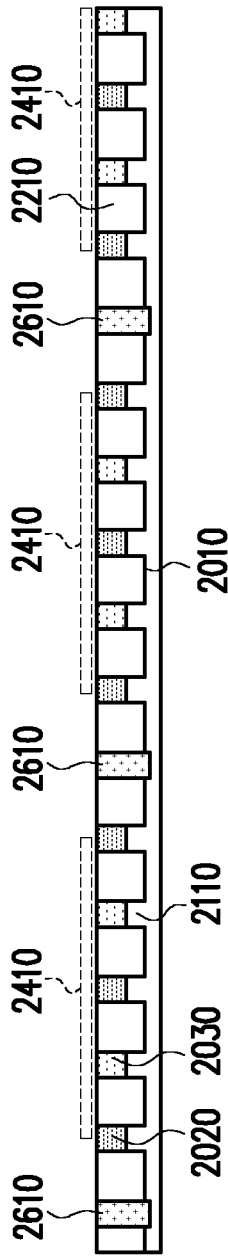

FIG. 26 illustrates an exemplary structure of the semiconductor device resulting after performance of a first providing operation, e.g., operation 340, and depicts the recesses 2510 are provided/filled with cut materials 2610. As illustrated in FIG. 26, the cut materials 2610 extend from above the substrate 2010 and into the substrate 2010. The first providing operation is performed using a deposition process, such as CVD, ALD, PVD, or the like.

Figure 27:
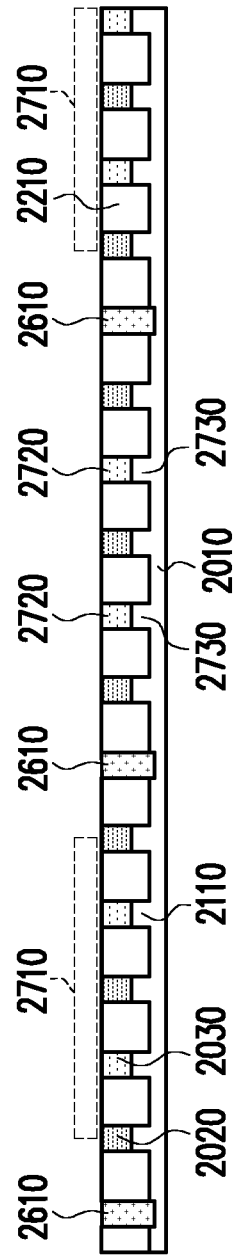

FIG. 27 illustrates an exemplary structure of the semiconductor device resulting after the first protective layer 2410 is stripped and certain of the second materials 2030 are covered with a second protective layer (indicated by dash lines 2710). As illustrated in FIG. 27, particular instances of second materials 2720 are not covered by the second protective layer 2710. As is apparent below, these second materials 2720 will be removed so as to expose, permitting removal of, dummy fins 2730, thereunder.

Figure 28:
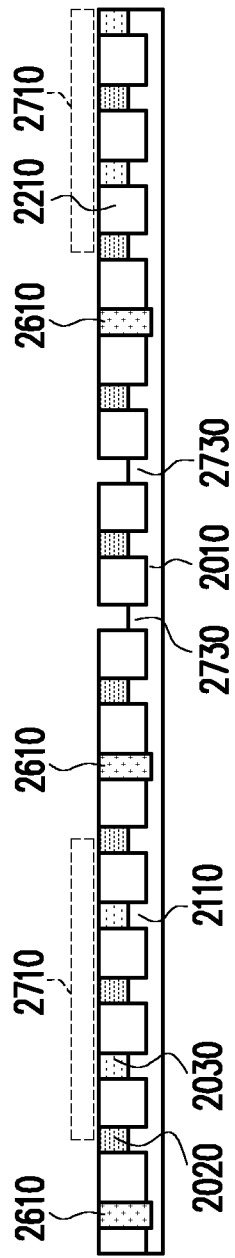

FIG. 28 illustrates an exemplary structure of the semiconductor device resulting after the second materials 2720 not covered by the second protective layer 2710 are etched, wet or dry, exposing the fins 2730, i.e., dummy fins, underlying those second materials 2720.

Figure 29:
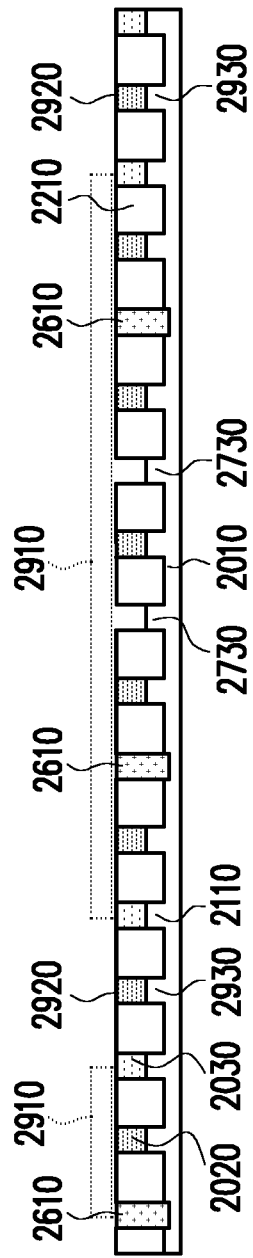

FIG. 29 illustrates an exemplary structure of the semiconductor device resulting after the second protective layer 2710 is stripped and performance of a second covering operation, e.g., operation 350, and depicts certain of the first materials 2020 are covered with a third protective layer (indicated by dash lines 2910). As illustrated in FIG. 29, particular instances of first materials 2920 are not covered by the third protective layer 2910. As described below, these first materials 2920 and the fins 2930 overlaid thereby will be replaced by cut materials. These cut materials, similar to the cut materials 2610, separate a gate electrode material into gate electrode lines, e.g., another adjacent pair of the gate electrode lines 140.

Figure 30:
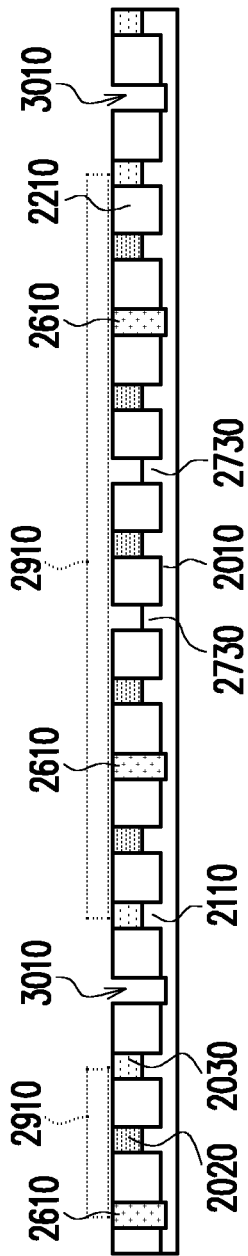

FIG. 30 illustrates an exemplary structure of the semiconductor device resulting after performance of a second removing operation, e.g., operation 360, and depicts the first materials 2920 not covered by the third protective layer 2910 and the fins 2930 underlying those first materials 2920 are dry or wet etched to form recesses 3010. As illustrated in FIG. 30, the recesses 3010, similar to the recesses 2510, extend through the dielectric layer 2210 and into the substrate 2010.

Figure 31:
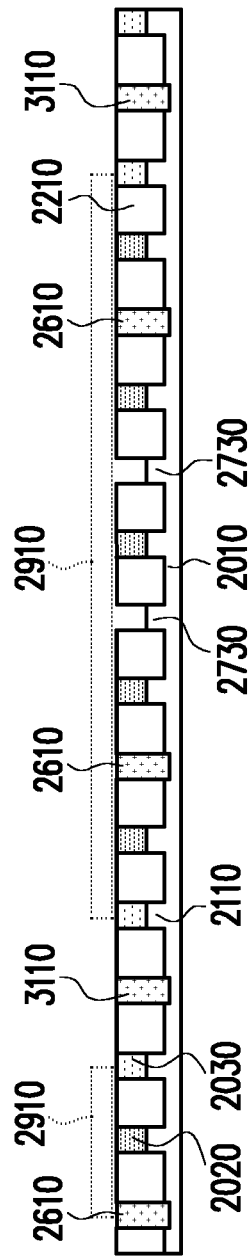

FIG. 31 illustrates an exemplary structure of the semiconductor device resulting after performance of a second providing operation, e.g., operation 370, and depicts the recesses 3010 are provided/filled, such as by CVD, ALD, PVD, or the like, with cut materials 3110. As illustrated in FIG. 31, the cut materials 3110 extend from above the substrate 2010 and into the substrate 2010. A cut material 3110 may be the same as or different from the cut material 2610.

Figure 32:
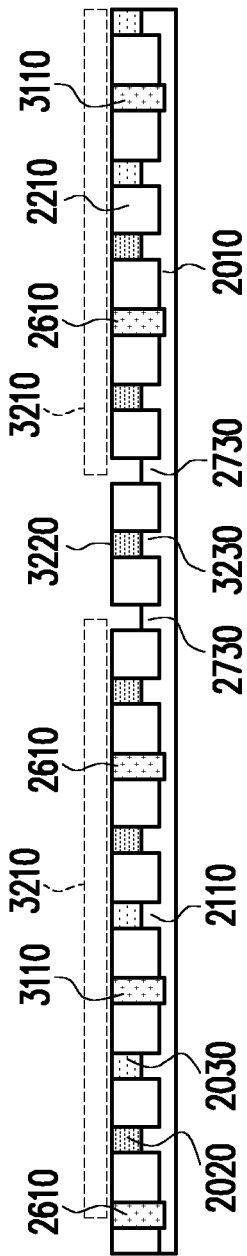

FIG. 32 illustrates an exemplary structure of the semiconductor device resulting after the third protective layer 2910 is stripped and certain of the first materials 2020 are covered with a fourth protective layer (indicated by dash lines 3210). As illustrated in FIG. 32, particular instances of first materials, e.g., first material 3220, are not covered by the fourth protective layer 3210. As is apparent below, these first materials 3220 will be removed so as to expose, permitting removal of, dummy fins, e.g., dummy fin 3230, thereunder.

Figure 33:
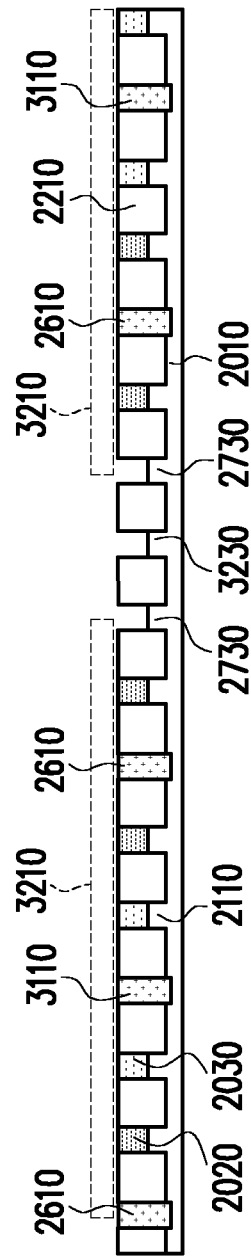

FIG. 33 illustrates an exemplary structure of the semiconductor device resulting after the first materials, e.g., the first material 3220, not covered by the fourth protective layer 3210 are etched, wet or dry, exposing the dummy fins, e.g., the dummy fin 3230, underlying those first materials.

Figure 34:
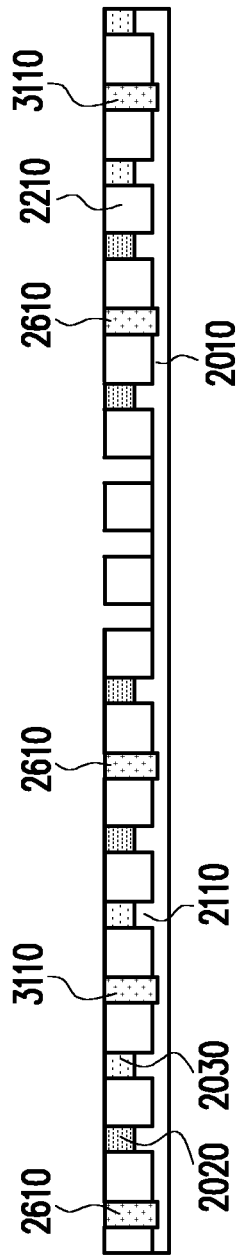

FIG. 34 illustrates an exemplary structure of the semiconductor device resulting after the fourth protective layer 3210 is stripped and the dummy fins 2730, 3230 are removed, such as by a dry or wet etching process.

Figure 35:
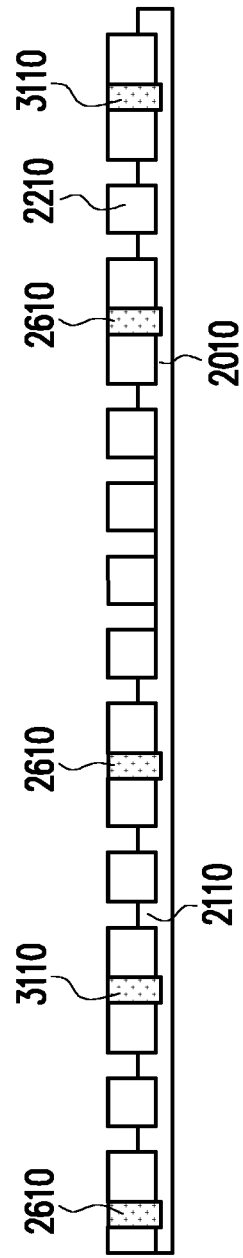

FIG. 35 illustrates an exemplary structure of the semiconductor device resulting after performance of a third removing operation, e.g., operation 380, and depicts the first and second materials 2020, 2030 are dry or wet etched, exposing the fins 2110, i.e., active fins, e.g., the fins 160, thereunder. FIG. 36 illustrates an exemplary structure of the semiconductor device resulting after the dielectric layer 2210 is dry or wet etched, exposing the substrate 2010 thereunder.

FIG. 37 illustrates an exemplary structure of the semiconductor device resulting after a gate electrode material 3710 is deposited, such as by CVD, ALD, PVD, or the like, over the structure of FIG. 36.

Figure 38:
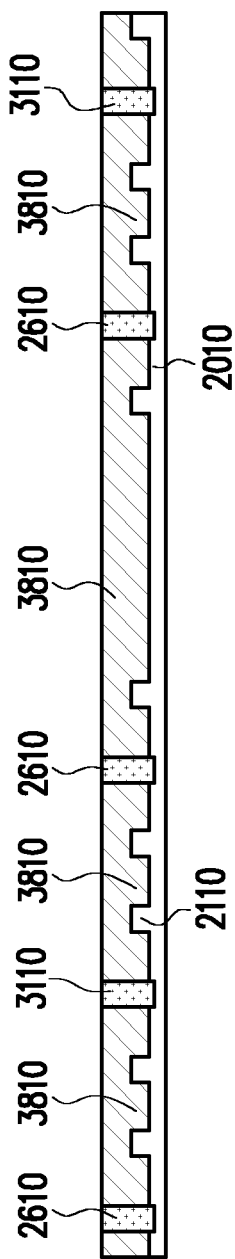

FIG. 38 illustrates an exemplary structure of the semiconductor device resulting after performance of a forming operation, e.g., operation 390, and depicts gate electrode lines 3810 (e.g., the gate electrode lines 140), an adjacent pair of which are respectively formed on opposite sidewalls of a cut material 2610/3110. In this embodiment, the forming operation includes performing a CMP process on the structure of FIG. 37 to remove excess gate electrode material 3710, i.e., the gate electrode material 3710 on top surfaces of the cut materials 2610, 3110 to thereby cut the gate electrode material 3710 into the gate electrode lines 3810. Thereafter, the cut materials 2610, 3110 are removed, such as by a wet or dry etching process, thereby resulting, e.g., in the structure of FIG. 2. In an alternative embodiment, a cut material 2610/3110 is retained in the semiconductor device.

Although the above-described operations are applied in the fabrication of one cell of a semiconductor device, two or more cells of a semiconductor device may be simultaneously fabricated using such operations.

Figure 39:
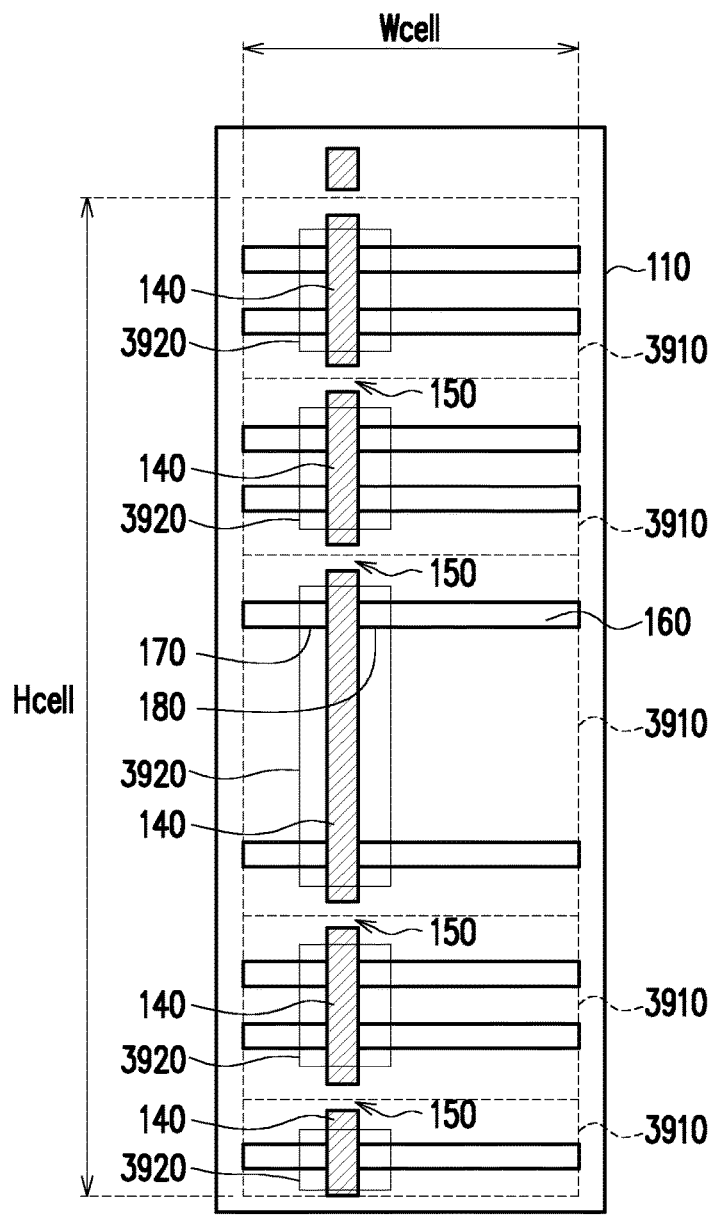
FIG. 39 is a schematic top view of the second exemplary embodiment of a semiconductor device.

FIG. 39 is a schematic top view of the second exemplary embodiment of a semiconductor device 3900. This embodiment differs from the previous embodiment in that the semiconductor device 3900 includes a plurality of cells 3910, each of which includes one or more transistors 3920. In this embodiment, each cut 150 is disposed at an interface of an adjacent pair of the cells 3910.

Since the methods of manufacturing the semiconductor device 3900 are similar to those described above with respect to the semiconductor device 100, a description thereof is omitted herein for the sake of brevity.

Figure 40:
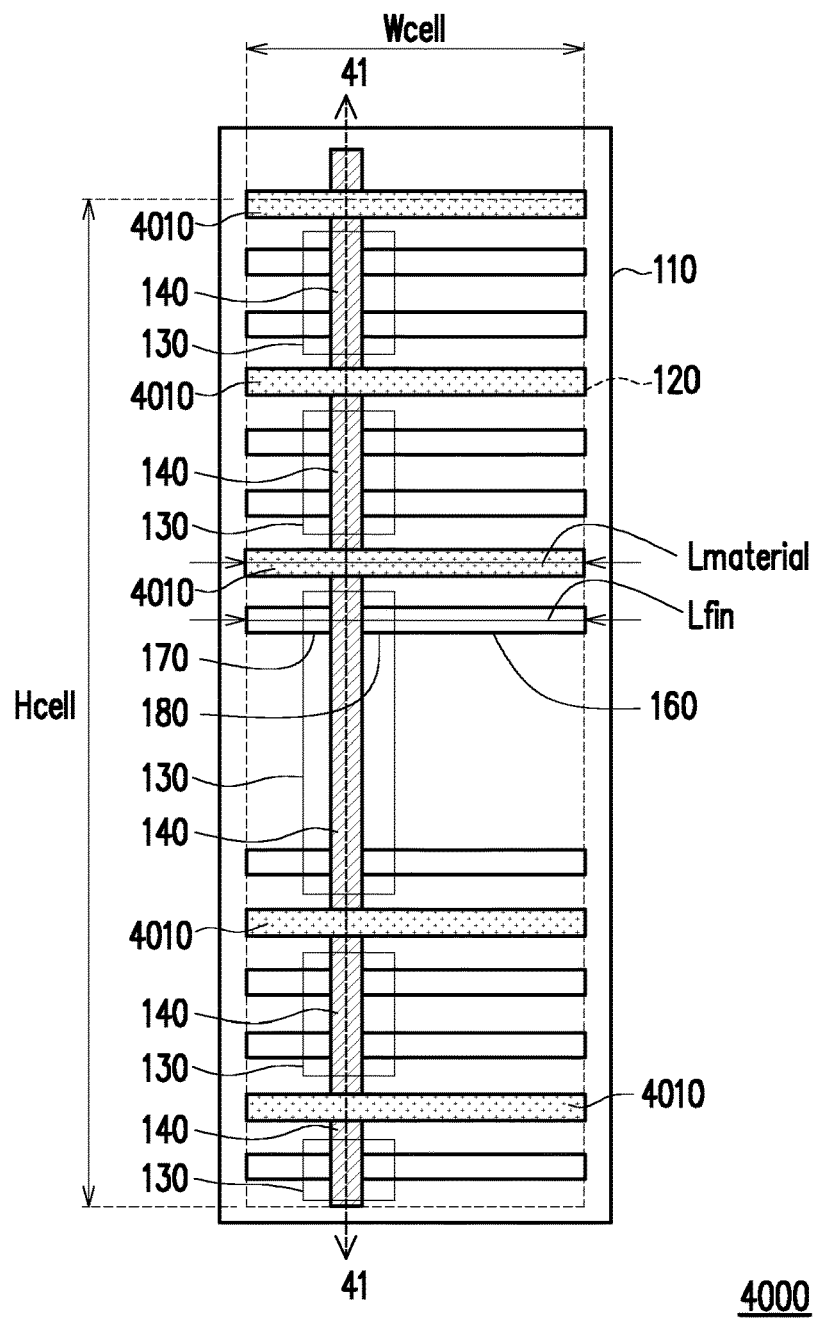
FIG. 40 is a schematic top view of the third exemplary embodiment of a semiconductor device.

FIG. 40 is a schematic top view of the third exemplary embodiment of a semiconductor device 4000. This embodiment differs from the semiconductor device 100 in that the semiconductor device 4000 further includes cut materials 4010 (e.g., cut material 710, 1210, 2610, or 3110), each of which extends in the second direction. Each cut material 4010 is provided in a cut 150 (see FIG. 1). That is, the cut materials 4010 are retained in the semiconductor device 4000 during the manufacture of the semiconductor device 4000. In this embodiment, a cut material 4010 has a material length (Lmaterial) substantially equal to a fin length (Lfin) of a fin 160. For example, the material length (Lmaterial) is about 0.8 to about 1.2 times the fin length (Lfin). In an implementation of the semiconductor device 4000, the material length (Lmaterial) is shortened, such as by lithographic and etching processes, to comply with a circuit design requirement.

Figure 41:
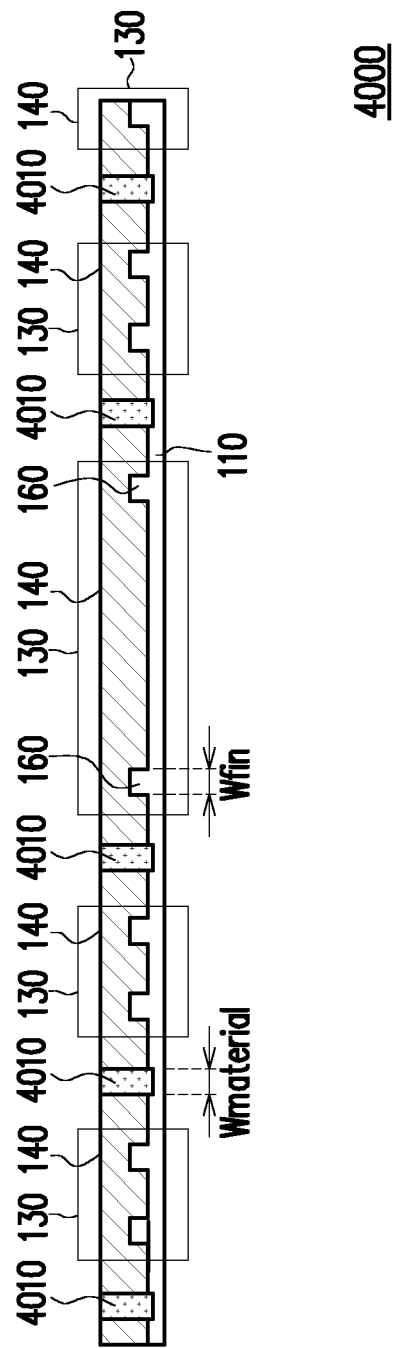
FIG. 41 is a sectional view taken along line 41-41 of FIG. 40.

FIG. 41 is a sectional view taken along line 41-41 of FIG. 40. As illustrated in FIG. 41, a cut material 4010 has a top surface substantially flush with a top surface of a gate electrode line 140. A cut material 4010 has a material width (Wmaterial) substantially equal to the fin width (Wfin). For example, the material width (Wcut) is about 0.8 to about 1.2 of the fin width (Wfin).

Since the methods of manufacturing the semiconductor device 4000 are similar to those described above with respect to the semiconductor device 100, a description thereof is omitted herein for the sake of brevity.

Figure 42:
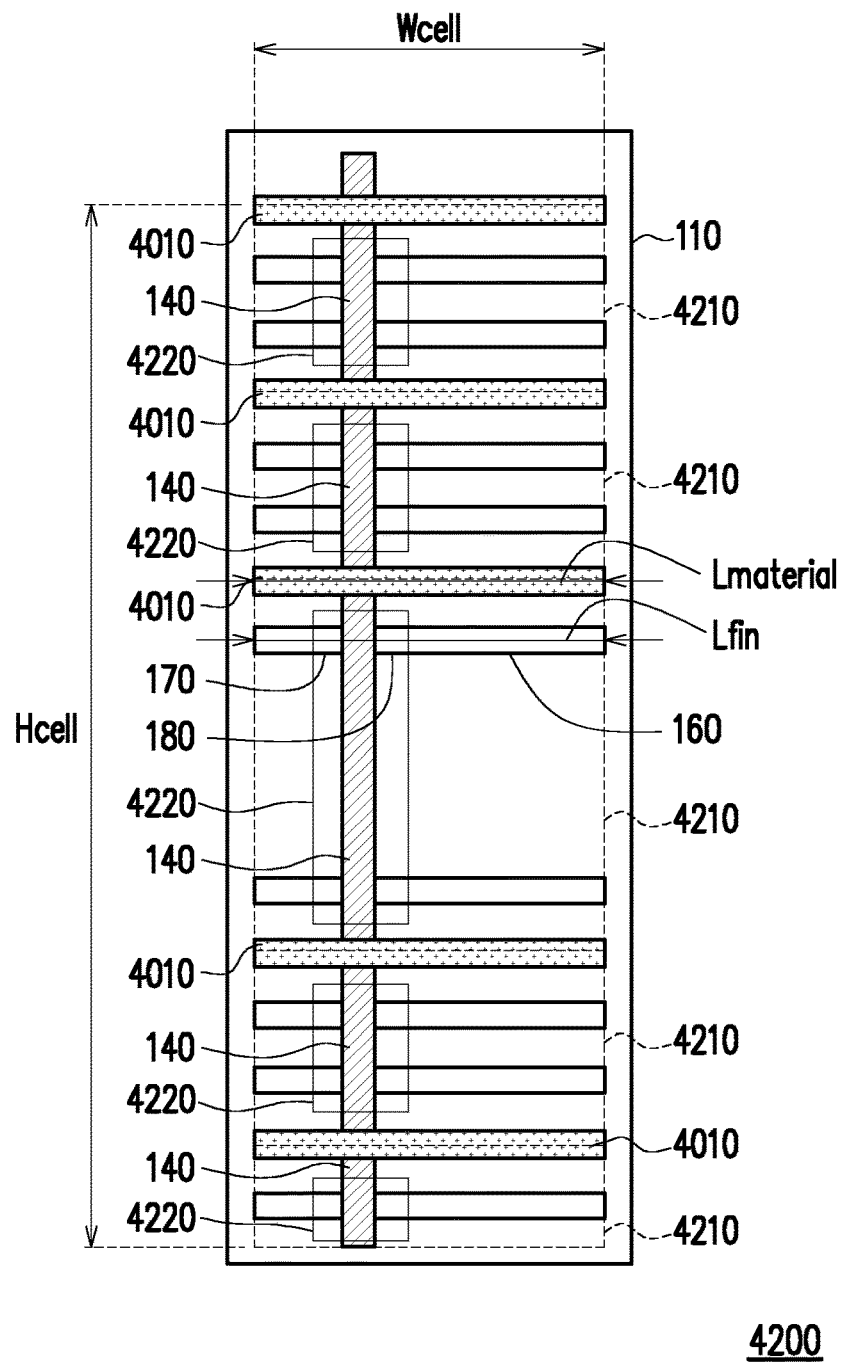
FIG. 42 is a schematic top view of the fourth exemplary embodiment of a semiconductor device.

FIG. 42 is a schematic top view of the fourth exemplary embodiment of a semiconductor device 4200. This embodiment differs from the semiconductor device 4000 in that the semiconductor device 4200 includes a plurality of cells 4210, each of which includes one or more transistors 4220. In this embodiment, each cut material 4010 is disposed at an interface of an adjacent pair of the cells 4210.

Since the methods of manufacturing the semiconductor device 4200 are similar to those described above with respect to the semiconductor device 100, a description thereof is omitted herein for the sake of brevity.

In one embodiment, a method of manufacturing a semiconductor device comprises providing a material above a substrate and respectively forming separate gate electrode lines on opposite sidewalls of the material.

In another embodiment, a semiconductor device comprises a substrate, a fin, and a pair of gate electrode lines. The fin extends is above the substrate, extends in a first direction, and includes source and drain regions and a channel region between the source and drain regions. The gate electrode lines extend in a second direction transverse to the first direction, are arranged along the length of the substrate, and are separated by a cut material that has a material width substantially equal to a fin width of the fin.

In another embodiment, a semiconductor device comprises a substrate, a fin, and a pair of gate electrode lines. The fin is above the substrate, extends in a first direction, and includes source and drain regions and a channel region between the source and drain regions. The gate electrode lines extend in a second direction transverse to the first direction, are arranged along the length of the substrate, and are separated by a cut that has a cut width substantially equal to a fin width of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a first material above a substrate using a deposition process;
   respectively forming gate electrode lines on opposite sidewalls of the first material; and
   wherein the first material has a material width less than a minimum cut width of a cut between the gate electrode lines, wherein the cut is formed using a lithographic process.

2. The method of claim 1, further comprising:
   receiving a semiconductor device including a second material above the substrate and a dielectric layer surrounding the second material;
   removing the second material to form a recess in the dielectric layer;
   filling the recess with the first material; and
   removing the dielectric layer, wherein forming the gate electrode lines includes depositing a gate electrode material over the substrate and the first material, and
   removing the gate electrode material on a top surface of the first material.

3. The method of claim 1, wherein the first material remains between the gate electrode lines, separating the gate electrode lines after the gate electrode lines are formed.

4. The method of claim 1, further comprising removing an upper portion of the substrate to form a fin that extends from a lower portion of the substrate and that has a fin width substantially equal to a material width of the first material.

5. The method of claim 1, further comprising:
   removing the first material to form a cut between the gate electrode lines; and
   removing an upper portion of the substrate to form a fin that extends from a lower portion of the substrate and that has a fin width substantially equal to a cut width of the cut.

6. The method of claim 1, further comprising receiving a semiconductor device including a pair of second materials above the substrate, a pair of third materials above the substrate and having an etch selectivity different from an etch selectivity of the pair of the second materials, and a dielectric layer surrounding the pair of the second materials and the pair of the third materials.

7. The method of claim 6, wherein receiving the semiconductor device is such that the pair of the second materials and the pair of the third materials are alternately arranged along the length of the substrate.

8. The method of claim 6, further comprising:
   removing one of the pair of the second materials to form a recess in the dielectric material;
   filling the recess with the first material; and
   removing the dielectric layer, wherein forming the gate electrode lines includes depositing a gate electrode material over the substrate and the first material, and
   removing the gate electrode material on a top surface of the first material.

9. The method of claim 6, further comprising:
removing one of the pair of the second materials;
removing one of the pair of the third materials; and
etching the substrate to form fins under the other of the pair of the second materials and the other of the pair of the third materials.

10. The method of claim 6, further comprising:
etching the substrate to form active and dummy fins under the pair of the second materials and the pair of the third materials; and
removing the dummy fins.

11. A semiconductor device comprising:
a substrate;
a fin above the substrate, extending in a first direction, and including a source region, a drain region, and a channel region between the source and drain regions; and
a pair of gate electrode lines extending in a second direction transverse to the first direction, arranged along the length of the substrate, and separated by a cut material that has a material width substantially equal to a fin width of the fin.

12. The semiconductor device of claim 11, wherein the cut material has a top surface substantially flush with a top surface of one of the pair of the gate electrode lines.

13. The semiconductor device of claim 11, wherein the cut material extends in the first direction.

14. The semiconductor device of claim 11, wherein the cut material has a material length substantially equal to a fin length of the fin.

15. The semiconductor device of claim 11, further comprising a cell configured to perform a circuit function and including a transistor that includes one of the pair of the gate electrode lines.

16. The semiconductor device of claim 11, further comprising a pair of cells, each of which includes a respective one of the pair of the gate electrode lines, wherein the cut material is at an interface of the pair of the cells.

17. A semiconductor device comprising:
a substrate;
a fin above the substrate, extending in a first direction, and including a source region, a drain region, and a channel region between the source and drain regions; and
a pair of gate electrode lines extending in a second direction transverse to the first direction, arranged along the length of the substrate, and separated by a cut that has a cut width substantially equal to a fin width of the fin.

18. The semiconductor device of claim 17, further comprising a cell configured to perform a circuit function and including the fin and the pair of the gate electrode lines.

19. The semiconductor device of claim 17, further comprising a pair of cells, each of which is over the substrate, one of which includes one of the pair of the gate electrode lines and the other of which includes the other of the pair of the gate electrode lines, wherein the cut is at an interface of the pair of the cells.

20. The semiconductor device of claim 17, wherein a location of the cut is not coincident with the fin.

* * * * *